(12) United States Patent
Yada et al.

(10) Patent No.: US 8,586,139 B2
(45) Date of Patent: Nov. 19, 2013

(54) METHOD FOR PRODUCING ELECTRODE COMPOSITE MATERIAL

(75) Inventors: Chihiro Yada, Susono (JP); Brian E. Hayden, Lyndhurst (GB); Duncan C. A. Smith, Southampton (GB); Christopher E. Lee, Southampton (GB)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 86 days.

(21) Appl. No.: 13/306,434

(22) Filed: Nov. 29, 2011

(65) Prior Publication Data
US 2013/0084406 A1    Apr. 4, 2013

(30) Foreign Application Priority Data
Sep. 29, 2011 (JP) ................ 2011-214322

(51) Int. Cl.
*C23C 16/00* (2006.01)
*B05D 3/06* (2006.01)
*H01B 1/00* (2006.01)

(52) U.S. Cl.
USPC ............. 427/248.1; 252/519.12; 423/598; 429/231.1; 429/231.5

(58) Field of Classification Search
None
See application file for complete search history.

(56) References Cited

U.S. PATENT DOCUMENTS

| | | | |
|---|---|---|---|
| 2007/0172739 A1* | 7/2007 | Visco et al. | 429/322 |
| 2009/0004371 A1* | 1/2009 | Johnson et al. | 427/126.1 |
| 2010/0104948 A1* | 4/2010 | Skotheim et al. | 429/322 |
| 2011/0045355 A1 | 2/2011 | Ichikawa | |

FOREIGN PATENT DOCUMENTS

| | | |
|---|---|---|
| JP | A-2007-5219 | 1/2007 |
| JP | A-2008-243560 | 10/2008 |
| JP | A-2011-65982 | 3/2011 |

* cited by examiner

*Primary Examiner* — Joseph Miller, Jr.
(74) *Attorney, Agent, or Firm* — Oliff & Berridge, PLC

(57) ABSTRACT

An object of the present invention is to simplify the process of producing an electrode composite material. Disclosed is a method for producing an electrode composite material, comprising the steps of: preparing a material comprising Li, La, Ti and O and heating the material, wherein the composition ratio between Li, La and Ti of the material is in the range of a triangle having three vertices at $LiO_{0.5}:LaO_{1.5}:TiO_2=23:24:53$, $LiO_{0.5}:LaO_{1.5}:TiO_2=5:36:59$ and $LiO_{0.5}:LaO_{1.5}:TiO_2=8:28:64$ in the $LiO_{0.5}$—$LaO_{1.5}$—$TiO_2$ triangular diagram.

12 Claims, 6 Drawing Sheets

METHOD FOR PRODUCING ELECTRODE COMPOSITE MATERIAL

TECHNICAL FIELD

The present invention relates to a method for producing an electrode composite material.

BACKGROUND ART

In recent years, with the rapid spread of IT-related devices and communication devices such as a cellular phone, emphasis is placed on the development of batteries used as the power source for such devices. In the automobile industry, the development of batteries with high power and high output for electric vehicles and hybrid vehicles, has been promoted. Among various kinds of batteries, a lithium battery attracts attention due to its high energy density and output.

A lithium battery generally has a positive electrode active material layer comprising a positive electrode active material, a negative electrode active material layer comprising a negative electrode active material, and an electrolyte layer present between the positive and negative electrode active material layers. In addition, it has a positive electrode collector which collects current from the positive electrode active material layer and a negative electrode collector which collects current from the negative electrode active material layer, as needed.

A lithium battery which uses a combustible organic electrolytic solution as the electrolyte layer provided between the positive electrode active material layer and the negative electrode active material layer requires safety measures against leakage, short circuits, overcharging, etc. Especially, batteries with high power and high capacity are required to achieve further improvement in safety. Therefore, research and development of all-solid-state batteries have been promoted, such as an all-solid-state lithium secondary battery using a solid electrolyte such as a sulfide- or oxide-based solid electrolyte.

Concerning all-solid-state batteries using a solid electrolyte, it has been proposed to form the positive and negative electrode active material layers with an electrode composite material which comprises an electrode active material and a solid electrolyte, in order to increase ion conductivity of the positive and negative electrode active material layers.

For example, Patent Literature 1 discloses an electrode for lithium batteries comprising an electrode composite material layer including a mixture of a plurality of first particles and a plurality of second particles, each of the plurality of first particles containing an electrode active material and each of the plurality of second particles containing a solid electrolyte. In Patent Literature 1, the electrode composite material layer is formed by mixing the plurality of first particles each containing an electrode active material (such as $LiMn_2O_4$ or $Li_4Ti_5O_{12}$) and the plurality of second particles each containing a solid electrolyte (such as $Li_{0.35}La_{0.55}TiO_3$), pressure-molding the mixture and the sintering the molded product.

CITATION LIST

Patent Literature 11: Japanese Patent Application Laid-Open (JP-A) No. 2011-065982
Patent Literature 2: JP-A 2008-243560
Patent Literature 3: JP-A 2007-005219

SUMMARY OF INVENTION

Technical Problem

However, conventional electrode composite material production methods as disclosed in Patent Literature 1 have a problem of complicated production process because an electrode active material and a solid electrolyte are prepared separately, and then they are mixed together and sintered.

Patent Literature 3 discloses that a thin film forming technique is used as the method for stacking a solid positive electrode, a solid electrolyte and a solid negative electrode, and it also discloses a method for forming a solid electrolyte layer comprising $LiPON(Li_3P(O,N)_4)$ by a sputtering method using $Li_3PO_4$ as a target. However, in the method disclosed in Patent Literature 3, a $Li_3PO_4$ sintered product is needed to be prepared as the target, so that there is a problem of complicated production process.

The present invention was achieved in light of the above circumstances, and an object of the present invention is to simplify the process of producing an electrode composite material.

Solution to Problem

The method for producing an electrode composite material of the present invention comprises the steps of:
preparing a material comprising Li, La, Ti and O and heating the material,
wherein the composition ratio between Li, La and Ti of the material is in the range of a triangle having three vertices at $LiO_{0.5}:LaO_{1.5}:TiO_2=23:24:53$, $LiO_{0.5}:LaO_{1.5}:TiO_2=5:36:59$ and $LiO_{0.5}:LaO_{1.5}:TiO_2=8:28:64$ in the $LiO_{0.5}$—$LaO_{1.5}$—$TiO_2$ triangular diagram.

According to the method of the present invention, it is possible to easily synthesize an electrode composite material comprising an electrode active material and a solid electrolyte by using as the starting material the above material having an intermediate condition between an electrode active material and a solid electrolyte. In addition, according to the production method of the present invention, a very pure electrode composite material in which only two phases (a solid electrolyte phase and an electrode active material phase) are present, can be synthesized by using the material having the above composition ratio.

In the material preparation step, the material can be prepared by vapor deposition, for example. In particular, the material is vapor-deposited by volatilizing an Li metal, La metal and Ti metal and irradiating the resulting metallic gas with oxygen plasma in the material preparation step.

In the heating step, for example, $Li_{3x}La_{2/3-x}TiO_3$ ($0.05 \leq x \leq 0.17$) can be produced.

Also in the heating step, for example, $TiO_{2-y}$ ($0 \leq y \leq 0.5$) can be produced.

Advantageous Effects of Invention

According to the present invention, it is possible to produce an electrode composite material comprising an electrode active material and a solid electrolyte by a simple process. Therefore, it is possible to reduce the cost of electrode composite material and thus to provide inexpensive batteries.

DESCRIPTION OF EMBODIMENTS

The method for producing an electrode composite material of the present invention comprises the steps of:
preparing a material comprising Li, La, Ti and O and heating the material,
wherein the composition ratio between Li, La and Ti of the material is in the range of a triangle having three vertices at $LiO_{0.5}:LaO_{1.5}:TiO_2=23:24:53$, $LiO_{0.5}:LaO_{1.5}:TiO_2=5:36:59$ and $LiO_{0.5}:LaO_{1.5}:TiO_2=8:28:64$ in the $LiO_{0.5}$—$LaO_{1.5}$—$TiO_2$ triangular diagram.

Figure 1:
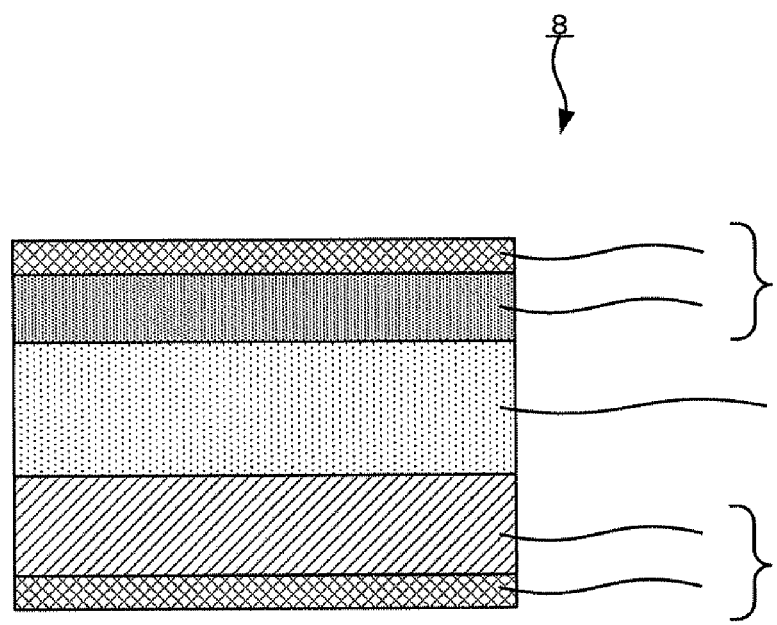
FIG. 1 is a schematic sectional view of an example of an all-solid-state battery.

FIG. 1 is a schematic sectional view of an example of an all-solid-state battery. In all-solid-state battery 8 shown in FIG. 1, positive electrode 1, solid electrolyte layer 3 and negative electrode 2 are stacked in this order, and solid electrolyte layer 3 is present between positive electrode 1 and negative electrode 2. Positive electrode 1 comprises, in this order from the solid electrolyte layer 3 side, positive electrode active material layer 4 comprising a positive electrode active material and a solid electrolyte, and positive electrode collector 5 which collects current from positive electrode active material layer 4. Negative electrode 2 comprises, in this order from the solid electrolyte layer 3 side, negative electrode active material layer 6 comprising a negative electrode active material and a solid electrolyte, and negative electrode collector 7 which collects current from negative electrode active material layer 6.

Conventionally, a electrode composite material which comprises an electrode active material (a positive or negative electrode active material) and a solid electrolyte and which is able to form a positive or negative electrode active material layer is produced by mixing an electrode active material and a solid electrolyte, which are prepared separately, and sintering the mixture as needed. However, such a production method has a problem of complicated production process and difficulty in obtaining an inexpensive electrode composite material.

As the result of diligent researches, the inventors of the present invention found out that an electrode composite material comprising an electrode active material and a solid electrolyte can be easily obtained by heating a material which comprises lithium (Li), lanthanum (La), titanium (Ti) and oxygen (O) and in which the composition ratio between Li, La and Ti of the material is in the range of a triangle having three vertices at $LiO_{0.5}:LaO_{1.5}:TiO_2=23:24:53$, $LiO_{0.5}:LaO_{1.5}:TiO_2=5:36:59$ and $LiO_{0.5}:LaO_{1.5}:TiO_2=8:28:64$ in the $LiO_{0.5}$—$LaO_{1.5}$—$TiO_2$ triangular diagram. In addition, it was found out that it is also possible to obtain an electrode composite material by heating the material having the above composition ratio, which composite contains no impurities such as a side reaction product, unreacted component and overreaction product and which is in a two-phase coexistence state in which an electrode active material phase and a solid electrolyte phase coexist.

The inventors of the present invention also found out that a composite material comprising an electrochemically-inactive component (such as $La_2Ti_2O_7$, $La_4Ti_9O_{24}$ or $La_2O_3$) is synthesized in the case of using a material in which the above composition ratio between Li, La and Ti is out of the above range.

It can be said that it is unexpected for those skilled in the art that a high-purity electrode composite material which does not include unnecessary impurities in the components thereof, can be obtained by using a material having such a specific composition ratio.

As just described, according to the present invention, it is possible to produce an electrode composite material by a simple process, so that it is possible to reduce the cost of producing an electrode composite material. In addition, according to the present invention, it is also possible to obtain a high-purity electrode composite material.

In the present invention, the electrode composite material comprises at least an electrode active material and a solid electrolyte. The electrode active material can be appropriately selected depending on the type or application of a desired battery and on the electrode, and it can be a positive electrode active material or a negative electrode active material. The solid electrolyte can be also selected depending on the type or application of a desired battery or on the electrode.

The electrode composite material of the present invention is suitable as one for forming an electrode active material layer of an all-solid-state battery; moreover, it is also applicable to batteries other than all-solid-state batteries.

Hereinafter, the steps of the method for producing an electrode composite material of the present invention, will be described in detail.

(Material Preparation Step)

The material preparation step is a step of preparing a material which comprises Li, La, Ti and O and in which the composition ratio between Li, La and Ti of the material is in the range of a triangle having three vertices at $LiO_{0.5}:LaO_{1.5}:TiO_2=23:24:53$, $LiO_{0.5}:LaO_{1.5}:TiO_2=5:36:59$ and $LiO_{0.5}:LaO_{1.5}:TiO_2=8:28:64$ in the $LiO_{0.5}$—$LaO_{1.5}$—$TiO_2$ triangular diagram.

Figure 2:
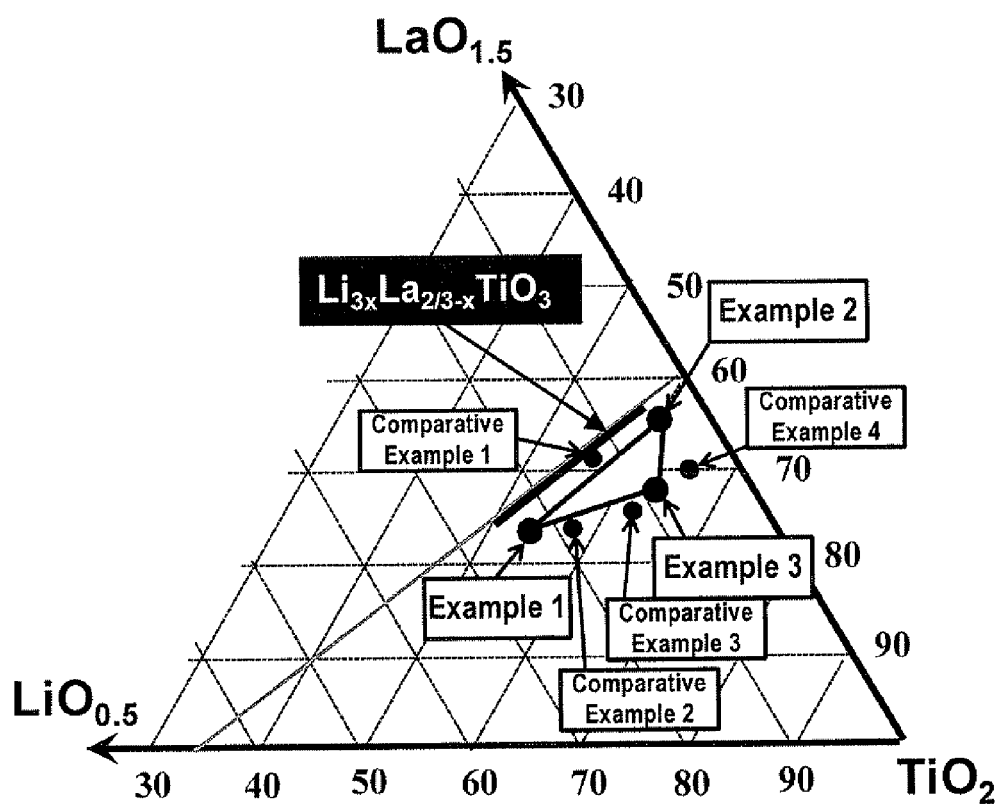
FIG. 2 is a $LiO_{0.5}$—$LaO_{1.5}$—$TiO_2$ triangular diagram showing composition ratios of Examples and Comparative Examples.

As shown in FIG. 2, the triangle in the $LiO_{0.5}$—$LaO_{1.5}$—$TiO_2$ triangular diagram is a triangle having three vertices at $LiO_{0.5}:LaO_{1.5}:TiO_2=23:24:53$ (Example 1), $LiO_{0.5}:LaO_{1.5}:TiO_2=5:36:59$ (Example 2) and $LiO_{0.5}:LaO_{1.5}:TiO_2=8:28:64$ (Example 3).

What is meant by saying that the composition ratio between Li, La and Ti is in the range of the triangle shown in the ternary triangular diagram, is that the composition ratio is represented by the coordinates which are inside the region that is bounded by the three sides of the triangle or which is on the three sides of the triangle. The coordinates in the triangular diagram is expressed in terms of mol %.

The material is not particularly limited as long as it comprises Li, La, Ti and O, and the composition ratio of the three components (Li, La, and Ti) is in the above range. For example, a thin film comprising Li, La and Ti can be used as the material, which is formed by a vapor deposition method. Or, a powder comprising Li, La, Ti and O can be used as the material.

As the method for forming a thin film by a vapor deposition method, there may be mentioned vacuum vapor deposition, sputtering, pulsed laser deposition (PLD) and so on, for example. Hereinafter, the method for preparing a material thin film by vacuum vapor deposition, will be explained.

Vacuum vapor deposition can be carried out in the vacuum condition of $1.0 \times 10^{-2}$ Pa to $1.0 \times 10^{-4}$ Pa or less, for example. Preferably, it is carried out in the ultra vacuum condition of $1.0 \times 10^{-7}$ Pa or less.

A substrate used for forming a thin film is generally heated to about 100 to 1,000° C. The substrate is preferably heated to a temperature of 100 to 700° C.

The substrate is required to be resistant to the heating temperature and to be flat and smooth. In the case of using an electron-conductive substrate, the substrate can be also used as an electrode collector. As the substrate, it is also possible to use a member which is adjacent to an electrode active material layer in the battery structure. For example, using a member having a solid electrolyte layer on a surface thereof as the substrate, a material thin film can be formed on the solid electrolyte layer.

Concrete examples of the substrate include an $Si/SiO_2/Ti/Pt$ laminate (the Pt surface is the vapor-deposited surface), an $Si/SiO_2/Ti_2/Pt$ laminate, MgO, an $Si/SiO_2/TiO_2/Pt/SrRuO_3$ laminate and an $SiO_2/Pt$ laminate.

The distance between an evaporation source and the substrate is preferably about 50 to 500 mm, for example.

An evaporation material is required to produce Li gas, La gas and Ti gas by heating by a heating source. For example, there may be mentioned the following: Li metal, $Li_2O$, $Li_2CO_3$ and the like as the Li source; La metal, $La_2O_3$ and the like as the La source; and Ti metal, $TiO_2$ and the like as the Ti source. A material comprising two or more kinds of Li, La and Ti can be used as the evaporation material. Preferred evaporation materials are Li metal, La metal and Ti metal.

The form of the evaporation material is not particularly limited. The evaporation materials can be separately heated and evaporated by using a plurality of evaporation sources. The material, form, etc., of a crucible in which the evaporation material is placed, can be appropriately selected depending on the type, heating temperature, etc., of the evaporation material. As the material of the crucible, there may be mentioned pyrolytic boron nitride and pyrolytic graphite, for example.

In the vacuum vapor deposition, the heating source is not particularly limited and there may be mentioned a resistant heating source and an electron beam heating source, for example. The heating source can be appropriately selected depending on the melting point, form, etc., of the evaporation material. It is also possible to use several kinds of heating sources in combination.

The heating temperature of the heating source can be appropriately determined depending on the melting point of the evaporation material, etc. It is possible to control the composition ratio of Li, La and Ti in the evaporation material by controlling the heating temperature of the heating source. For example, more Li can be evaporated by increasing the heating temperature of the Li source; therefore, the Li amount in the material can be increased. Similarly, the La amount in the material can be increased by increasing the heating temperature of the La source, while the Ti amount in the material can be increased by increasing the heating temperature of the Ti source.

To obtain the material having the above composition ratio, for example, the heating temperature of the Li source can be about 100 to 600° C.; the heating temperature of the La source can be about 300 to 1,000° C.; and the heating temperature of the Ti source can be about 300 to 1,000° C.

By irradiating the evaporation materials evaporated as explained above with oxygen plasma, the material comprising Li, La, Ti and O (a composite oxide) can be deposited on the substrate to form a thin film. The method for generating oxygen plasma is not particularly limited and a known method or apparatus can be used.

The vapor deposition time is not particularly limited and can be appropriately determined. For example, it is preferably 10 minutes or more and 5 hours or less, and more preferably 30 minutes or more and 3 hours or less. If the time is less than 10 minutes, the thin film thus formed is too thin; therefore, there is a possibility that an electrode composite material having a sufficient charging and discharging capacity cannot be obtained. If the time is more than 5 hours, there is a possibility that the thin layer is detached from the substrate. The vapor deposition time is such that the point of time when the material begins to be deposited on the substrate, is determined as zero.

Next, the material which comprises a powder comprising Li, La, Ti and O will be explained.

The powder comprising Li, La, Ti and O can be one kind of powder or a mixture of several kinds of powders. For example, it is possible to use a powder mixture which comprises an Li metal and/or a lithium compound as the Li source, an La metal and/or an La compound as the La source, and a Ti metal and/or a Ti compound as the Ti source, and which contains an oxygen-containing compound as at least one of these compounds. In the powder mixture, two or more of the Li, La and Ti sources can be a common compound (the same compound).

As the Li compound, there may be mentioned $Li_2O$ and $Li_2CO_3$, for example. As the La compound, there may be mentioned $La_2O_3$, for example. As the Ti compound, there may be mentioned $TiO_2$, for example.

In the material comprising the powder(s), the composition ratio of Li, La and Ti can be controlled depending on the composition ratio of the elements contained in a used powder, the mixing ratio of powders used in combination, etc.

(Heating Step)

The heating step is a step of heating the material prepared in the material preparation step. A solid electrolyte and/or an electrode active material is produced by heating the material, thereby obtaining an electrode composite material comprising the solid electrolyte and the electrode active material. In the heating step, typically, a crystal of the solid electrolyte and/or a crystal of the electrode active material is produced.

The heating atmosphere of the heating step is not particularly limited and there may be mentioned an air atmosphere, an oxygen atmosphere, an Ar atmosphere, a nitrogen atmosphere, etc.

The heating temperature of the heating step can be appropriately determined. In general, it is preferably 500° C. or more and 1,000° C. or less, more preferably 600° C. or more and 900° C. or less. When the temperature is less than 500° C., there is a possibility that crystallization of the thus-produced solid electrolyte and/or crystallization of the thus-produced electrode active material is insufficient. On the other hand, when the temperature exceeds 1,000° C., there is a possibility that the lithium in the material is volatilized to change the composition.

As the solid electrolyte, which is a product obtained by heating the material, there may be mentioned $Li_{3x}La_{2/3-x}TiO_3$ (x satisfies $0.05 \leq x \leq 0.17$ and is preferably $0.07 \leq x \leq 0.15$), for example. As the electrode active material, which is a product obtained by heating the material, there may be mentioned $TiO_{2-y}$ (y satisfied $0 \leq y \leq 0.5$ and is preferably $0 \leq y \leq 0.3$), for example.

Typically, the electrode composite material of the present invention can be suitably used as a material for forming an electrode (an electrode active material layer) of a lithium battery. It can be also used for other kinds of batteries.

The method for forming an electrode active material layer using the electrode composite material of the present invention is not particularly limited and known methods can be used. For example, in the case of preparing the above material by vapor deposition, as explained above, an electrode active material layer can be formed by vapor-depositing the material on a member which is adjacent to an electrode active material layer (such as a solid electrolyte layer or electrode collector) and heating the vapor-deposited material. In the case of using a powder as the above material, an electrode active material layer can be formed by appropriately mixing the electrode composite material obtained by the heating step with a solvent and applying or rolling the mixture, for example.

EXAMPLES

Production of Electrode Composite Material

Example 1

First, in the following manner, an Li—La—Ti—O thin film was vapor-deposited on a substrate (a Si/SiO$_2$/Ti/Pt laminate manufactured by Nova Electronic Materials, Inc.) by physical vapor deposition (PVD) method.

In particular, first, a lithium ribbon (99.9%, manufactured by Sigma-Aldrich Corporation), lanthanum (99.9%, manufactured by Sigma-Aldrich Corporation) and titanium slag (99.98%, manufactured by Alfa Aesar) were separately placed inside a chamber kept under a high vacuum of $1 \times 10^{-8}$ Pa ($1 \times 10^{-10}$ mBar) or less. More specifically, the lithium ribbon was placed in a crucible made of pyrolytic boron nitride, while the lanthanum and titanium slag were each placed in a 40 cm$^3$ crucible made of pyrolytic graphite.

Next, the lithium ribbon in the crucible was volatilized by resistance heating, using a Knudsen cell as the evaporation source. The lanthanum in the crucible and the titanium slag in the crucible were each volatilized by electron beams.

Then, using an oxygen plasma generator (HD25 RF source manufactured by Oxford Applied Research), oxygen plasma was generated inside the PVD chamber to irradiate volatilized metal gases with the oxygen plasma, thereby vapor-depositing an Li—La—Ti—O composite oxide on the substrate. The distance between each evaporation material and the substrate was 500 mm. The vapor-deposited area was 0.785 cm$^2$. The substrate temperature was 700° C. The vapor-deposition time was 60 minutes.

The thus-obtained vapor-deposited film was heated at 750° C. for 3 hours in the air, thereby obtaining a crystalline thin film.

The composition ratio of the obtained thin film was obtained with an ICP-MS system (Elan 9000 manufactured by Perkin Elmer). The composition ratio thus obtained was LiO$_{0.5}$:LaO$_{1.5}$:TiO$_2$=23:24:53. The result is shown in the LiO$_{0.5}$—LaO$_{1.5}$—TiO$_2$ triangular diagram of FIG. 2.

Figure 3:
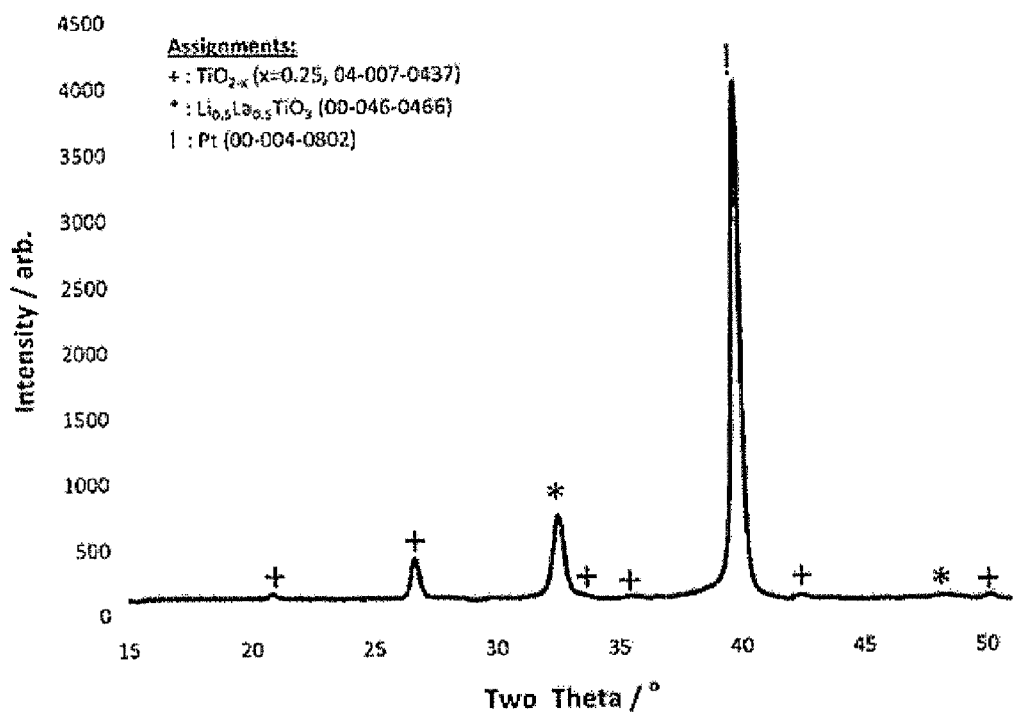
FIG. 3 shows XRD analysis result of Example 1.

XRD measurement was performed on the thus-obtained crystalline thin film, using an XRD analyzer (D8 Discover manufactured by Bruker Corporation). The result is shown in FIG. 3. As shown in FIG. 3, it was found that the thin film is in a two-phase coexistence state in which only two phases, an Li$_{3x}$La$_{2/3-x}$TiO$_3$ phase (Li$_{0.5}$La$_{0.5}$TiO$_3$ phase) and a TiO$_{1.75}$ phase, are present. Pt is a component of the substrate.

Example 2

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was LiO$_{0.5}$:LaO$_{1.5}$:TiO$_2$=5:36:59. The composition ratio is shown in the LiO$_{0.5}$—LaO$_{1.5}$—TiO$_2$ triangular diagram of FIG. 2.

Figure 4:
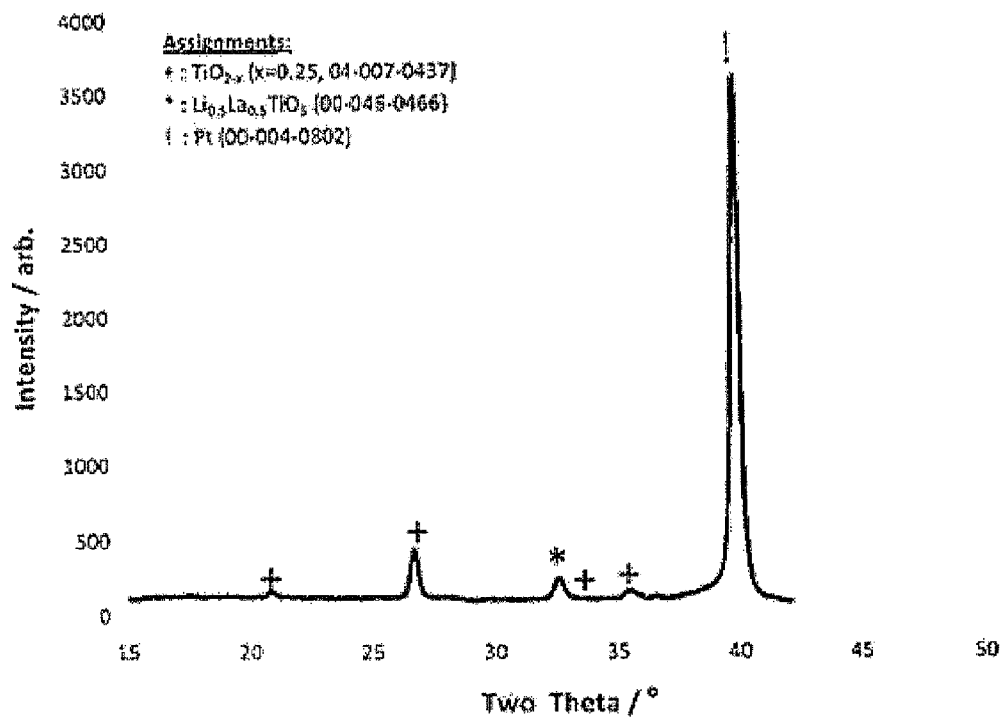
FIG. 4 shows XRD analysis result of Example 2.

XRD measurement was performed in the thus-obtained crystalline thin film; therefore, as shown in FIG. 4, it was found that the thin film is in a two-phase coexistence state in which an Li$_{3x}$La$_{2/3-x}$TiO$_3$ phase (Li$_{0.5}$La$_{0.5}$TiO$_3$ phase) and a TiO$_{1.75}$ phase are present. Pt is a component of the substrate.

Example 3

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was LiO$_{0.5}$:LaO$_{1.5}$:TiO$_2$=8:28:64. The composition ratio is shown in the LiO$_{0.5}$—LaO$_{1.5}$—TiO$_2$ triangular diagram of FIG. 2.

Figure 5:
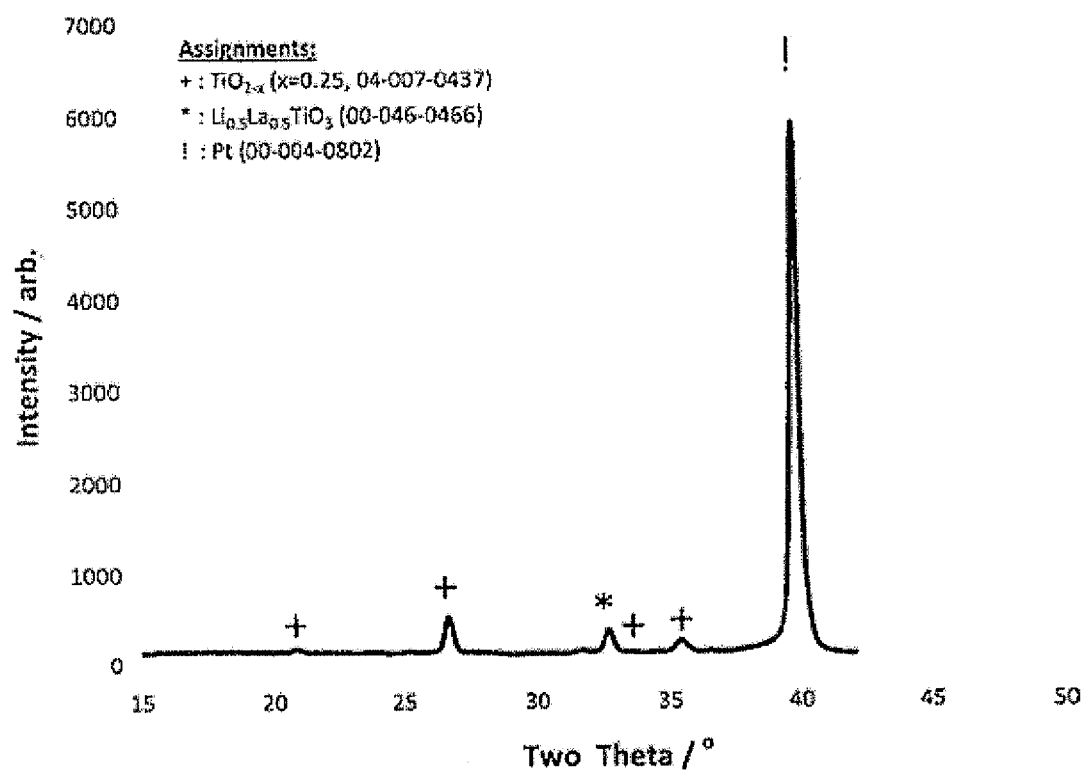
FIG. 5 shows XRD analysis result of Example 3.

XRD measurement was performed in the thus-obtained crystalline thin film; therefore, as shown in FIG. 5, it was found that the thin film is in a two-phase coexistence state in which an Li$_{3x}$La$_{2/3-x}$TiO$_3$ phase (Li$_{0.5}$La$_{0.5}$TiO$_3$ phase) and a TiO$_{1.75}$ phase are present. Pt is a component of the substrate.

Comparative Example 1

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was LiO$_{0.5}$:LaO$_{1.5}$:TiO$_2$=13:32:55. The composition ratio is shown in the LiO$_{0.5}$—LaO$_{1.5}$—TiO$_2$ triangular diagram of FIG. 2.

Figure 6:
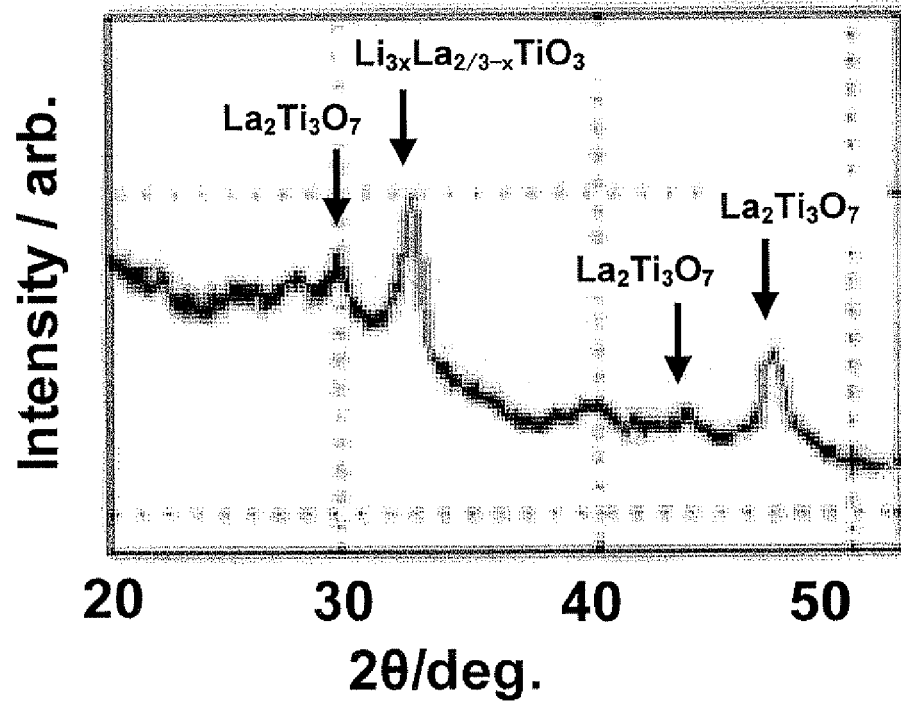
FIG. 6 shows XRD analysis result of Comparative Example 1.

XRD measurement was performed in the thus-obtained crystalline thin film; therefore, as shown in FIG. 6, no TiO$_{1.75}$ phase was detected, which functions as an electrode active material, and an La$_2$Ti$_3$O$_7$ phase was detected. Since no electrode active material is contained and La$_2$Ti$_3$O$_7$ is electrochemically inactive, the crystalline thin film of Comparative Example 1 is not usable as an electrode composite material.

Comparative Example 2

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was LiO$_{0.5}$:LaO$_{1.5}$:TiO$_2$=18:24:58. The composition ratio is shown in the LiO$_{0.5}$—LaO$_{1.5}$—TiO$_2$ triangular diagram of FIG. 2.

Figure 7:
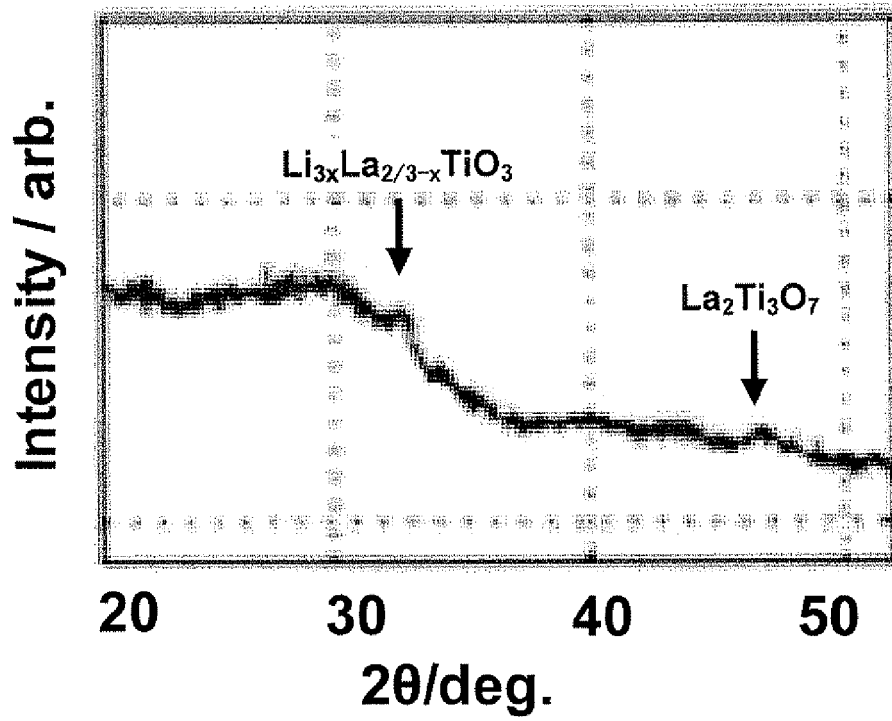
FIG. 7 shows XRD analysis result of Comparative Example 2.

XRD measurement was performed in the thus-obtained crystalline thin film; therefore, as shown in FIG. 7, similarly to Comparative Example 1, no TiO$_{1.75}$ phase was detected, which functions as an electrode active material, and an La$_2$Ti$_3$O$_7$ phase was detected, which is electrochemically inactive. Since no electrode active material is contained and La$_2$Ti$_3$O$_7$ is electrochemically inactive, the crystalline thin film of Comparative Example 2 is not usable as an electrode composite material.

Comparative Example 3

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was $LiO_{0.5}$:$LaO_{0.5}$:$TiO_2$=12:26:62. The composition ratio is shown in the $LiO_{0.5}$—$LaO_{1.5}$—$TiO_2$ triangular diagram of FIG. 2.

Figure 8:
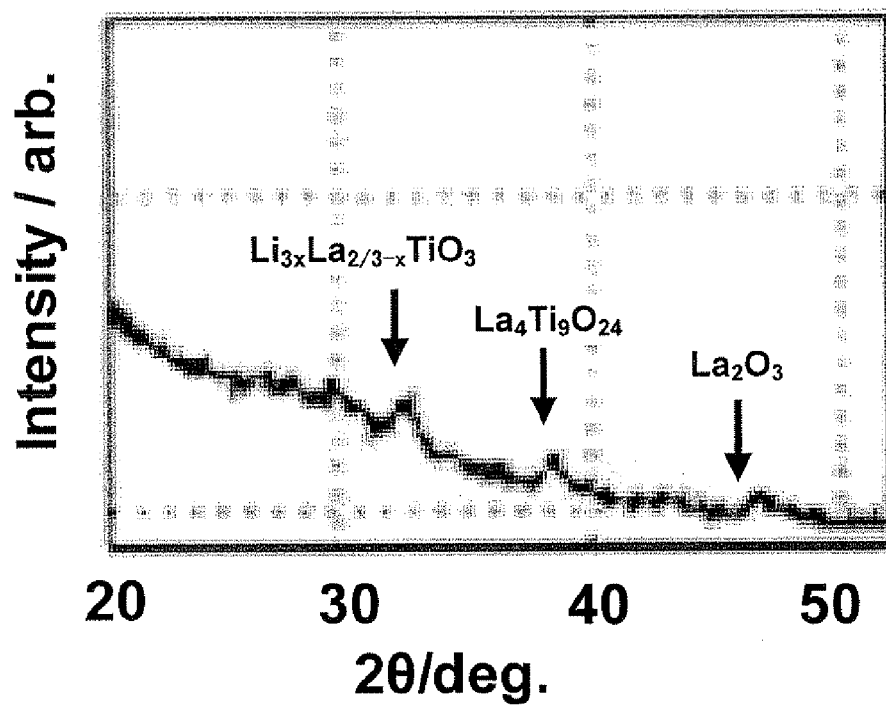
FIG. 8 shows XRD analysis result of Comparative Example 3.

XRD measurement was performed in the thus-obtained crystalline thin film; therefore, as shown in FIG. 8, no $TiO_{1.75}$ phase was detected, which functions as an electrode active material, and an $La_4Ti_9O_{24}$ phase and an $La_2O_3$ phase were detected. Since no electrode active material is contained and $La_4Ti_9O_{24}$ and $La_2O_3$ are electrochemically inactive, the crystalline thin film of Comparative Example 3 is not usable as an electrode composite material.

Comparative Example 4

A crystalline thin film was obtained in the same manner as Example 1, except that the output (heating temperature) at the time of volatilizing the lithium by resistance heating and the output (heating temperature) at the time of volatilizing the lanthanum and titanium by electron beams, were changed.

The composition ratio of the obtained thin film was $LiO_{0.5}$:$LaO_{15}$:$TiO_2$=5:30:65. The composition ratio is shown in the $LiO_{0.5}$—$LaO_{1.5}$—$TiO_2$ triangular diagram of FIG. 2.

Figure 9:
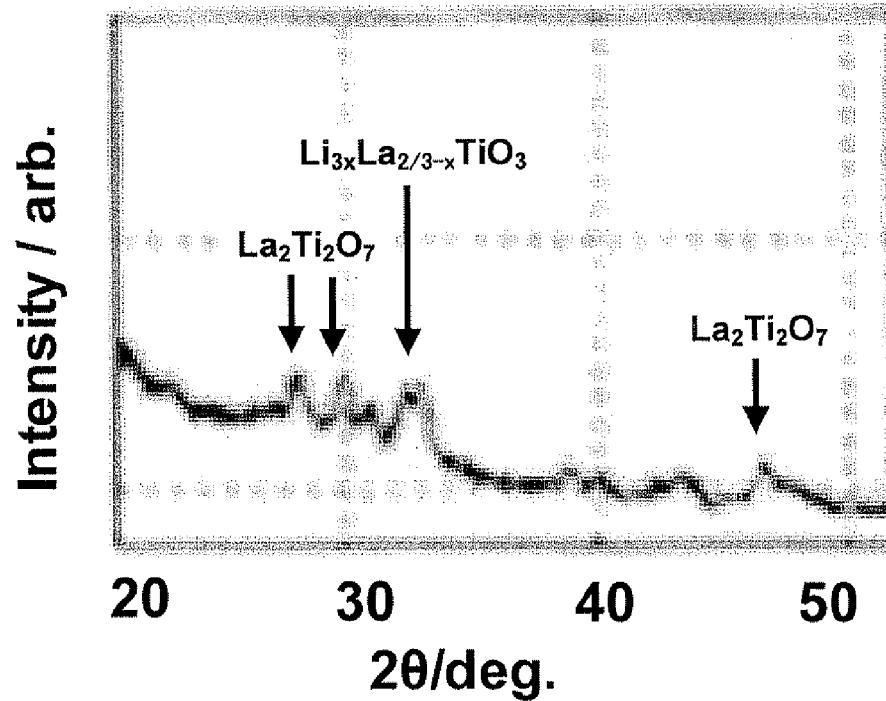
FIG. 9 shows XRD analysis result of Comparative Example 4.

XRD measurement was performed in the thus-obtained crystal line thin film; therefore, as shown in FIG. 9, similarly to Comparative Example 1, no $TiO_2$ phase was detected, which functions as an electrode active material, and an $La_2Ti_3O_7$ phase was detected, which is electrochemically inactive. Since no electrode active material is contained and $La_2Ti_3O_7$ is electrochemically inactive; therefore, the crystalline thin film of Comparative Example 4 is not usable as an electrode composite material.

It was found that a composite in which two phases of electrode active material ($TiO_{1.75}$) phase and solid electrolyte ($Li_{0.5}La_{0.5}TiO_3$) phase coexist, can be synthesized in one step by heating a composite oxide having a composition represented by the region of a triangle having three vertices at, as shown in FIG. 2, $LiO_{0.5}$:$LaO_{1.5}$:$TiO_2$=23:24:53, $LiO_{0.5}$:$LaO_{1.5}$:$TiO_2$=5:36:59 and $LiO_{0.5}$:$LaO_{1.5}$:$TiO_2$=8:28:64 in the $LiO_{0.5}$—$LaO_{1.5}$—$TiO_2$ triangular diagram (that is, a composition represented by the region defined by these three points). On the other hand, a compound which functions as an electrode active material is not produced by heating the composite oxides of Comparative Examples 1 to 4, each of which has a composition that is outside the region of the triangle. In addition, it was found that an electrochemically-inactive impurity is produced by heating them.

REFERENCE SIGNS LIST

1. Positive electrode
2. Negative electrode
3. Solid electrolyte
4. Positive electrode active material layer
5. Positive electrode collector
6. Negative electrode active material layer
7. Negative electrode collector
8. All-solid-state battery

The invention claimed is:

1. A method for producing an electrode composite material comprising an electrode active material and a solid electrolyte, the method comprising the steps of:
preparing a starting material comprising Li, La, Ti and O and
heating the starting material,
wherein the composition ratio between Li, La and Ti of the starting material is in the range of a triangle having three vertices at $LiO_{0.5}$:$LaO_{1.5}$:$TiO_2$=23:24:53, $LiO_{0.5}$:$LaO_{1.5}$:$TiO_2$=5:36:59 and $LiO_{0.5}$:$LaO_{1.5}$:$TiO_2$=8:28:64 in the $LiO_{0.5}$—$LaO_{1.5}$—$TiO_2$ triangular diagram.

2. The method for producing an electrode composite material according to claim 1, wherein the starting material is prepared by vapor deposition in the starting material preparation step.

3. The method for producing an electrode composite material according to claim 2, wherein the starting material is vapor-deposited by volatilizing an Li metal, La metal and Ti metal and irradiating the resulting metallic gas with oxygen plasma in the starting material preparation step.

4. The method for producing an electrode composite material according to claim 1, wherein $Li_{3x}La_{2/3-x}TiO_3$ ($0.05 \leq x \leq 0.17$), which is the solid electrolyte, is produced in the heating step.

5. The method for producing an electrode composite material according to claim 1, wherein $TiO_{2-y}$ ($0 \leq y \leq 0.5$), which is the electrode active material, is produced in the heating step.

6. The method for producing an electrode composite material according to claim 1, wherein $Li_{3x}La_{2/3-x}TiO_3$ ($0.05 \leq x \leq 0.17$), which is the solid electrolyte, and $TiO_{2-y}$ ($0 \leq y \leq 0.5$), which is the electrode active material, are produced in the heating step.

7. The method for producing an electrode composite material according to claim 2, wherein $Li_{3x}La_{2/3-x}TiO_3$ ($0.05 \leq x \leq 0.17$), which is the solid electrolyte, is produced in the heating step.

8. The method for producing an electrode composite material according to claim 3, wherein $Li_{3x}La_{2/3-x}TiO_3$ ($0.05 \leq x \leq 0.17$), which is the solid electrolyte, is produced in the heating step.

9. The method for producing an electrode composite material according to claim 2, wherein $TiO_{2-y}$ ($0 \leq y \leq 0.5$), which is the electrode active material, is produced in the heating step.

10. The method for producing an electrode composite material according to claim 3, wherein $TiO_{2-y}$ ($0 \leq y \leq 0.5$), which is the electrode active material, is produced in the heating step.

11. The method for producing an electrode composite material according to claim 2, wherein $Li_{3x}La_{2/3-x}TiO_3$ ($0.05 \leq x \leq 0.17$), which is the solid electrolyte, and $TiO_{2-y}$ ($0 \leq y \leq 0.5$), which is the electrode active material, are produced in the heating step.

12. The method for producing an electrode composite material according to claim 3, wherein $Li_{3x}La_{2/3-x}TiO_3$ ($0.05 \leq x \leq 0.17$), which is the solid electrolyte, and $TiO_{2-y}$ ($0 \leq y \leq 0.5$), which is the electrode active material, are produced in the heating step.

* * * * *